(12) United States Patent
Elumalai et al.

(10) Patent No.: US 12,733,446 B2
(45) Date of Patent: Sep. 8, 2026

(54) CATHODE ASSEMBLY FOR INTEGRATION OF EMBEDDED ELECTROSTATIC CHUCK (ESC)

(71) Applicant: Applied Materials, Inc., Santa Clara, CA (US)

(72) Inventors: Karthik Elumalai, Singapore (SG); Arunkumar Tatti, Haveri (IN); Muhammad Danial Bin Mohamed Yunos, Singapore (SG); Eng Sheng Peh, Singapore (SG); Cheng Sun, Singapore (SG); Ye Y Liu, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 19/351,232

(22) Filed: Oct. 6, 2025

(65) Prior Publication Data

US 2026/0040884 A1 Feb. 5, 2026

Related U.S. Application Data

(63) Continuation of application No. 18/586,307, filed on Feb. 23, 2024, now Pat. No. 12,463,075.

(51) Int. Cl.
*H10P 72/72* (2026.01)
*H01J 37/32* (2006.01)

(52) U.S. Cl.
CPC ...... *H10P 72/722* (2026.01); *H01J 37/32577* (2013.01); *H01J 37/32724* (2013.01)

(58) Field of Classification Search
CPC ............... H10P 72/722; H10P 72/0434; H10P 72/7624; H01J 37/32577; H01J 37/32724;
(Continued)

(56) References Cited

U.S. PATENT DOCUMENTS 9,117,868 B1 * 8/2015 Nangoy ................ H10P 72/722
9,196,498 B1 * 11/2015 Nangoy .............. H10P 72/7402
(Continued)

FOREIGN PATENT DOCUMENTS

KR 100633978 B1 10/2006
KR 1020100107221 A 10/2010

OTHER PUBLICATIONS

International Search Report and Written Opinion from PCTUS2025/013389 mailed May 9, 2025, 10 pgs.
(Continued)

*Primary Examiner* — Adam D Houston
(74) *Attorney, Agent, or Firm* — Schwabe, Williamson & Wyatt, P.C.

(57) ABSTRACT

Embodiments disclosed herein include an apparatus that includes an electrostatic chuck (ESC). The electrostatic chuck may include a first body that is electrically conductive, and a ceramic insert on the first body with an electrode embedded within the ceramic insert. In an embodiment, the apparatus may further include a facility plate that is coupled to the ESC. The facility plate may include a second body that is electrically conductive with a hole through the second body. In an embodiment, a DC input connector is provided through the hole, and an RF feed line is coupled to the second body. In an embodiment, a pin of the DC input connector is electrically isolated from the RF feed line.

11 Claims, 9 Drawing Sheets

(58) Field of Classification Search

CPC ........... H01J 37/32568; H01J 37/32697; H01J 37/32715

See application file for complete search history.

(56) References Cited

U.S. PATENT DOCUMENTS

| | | | | |
|---|---|---|---|---|
| 11,794,296 | B2 * | 10/2023 | Chadha | B23Q 3/15 |
| 12,165,899 | B2 * | 12/2024 | Oki | H10P 72/722 |
| 12,347,659 | B2 * | 7/2025 | Parkhe | H01J 37/32724 |
| 2004/0027781 | A1 | 2/2004 | Hanawa et al. | |
| 2004/0223286 | A1 | 11/2004 | Chu et al. | |
| 2011/0209989 | A1 | 9/2011 | Li et al. | |
| 2013/0127124 | A1 | 5/2013 | Nam et al. | |
| 2013/0286531 | A1 | 10/2013 | Shiraiwa et al. | |
| 2015/0221481 | A1 * | 8/2015 | Willwerth | H01J 37/32715 204/298.37 |
| 2015/0331337 | A1 * | 11/2015 | Sundarrajan | G03F 7/70733 355/72 |
| 2015/0340225 | A1 * | 11/2015 | Kim | C23C 16/04 118/728 |
| 2017/0110356 | A1 | 4/2017 | Matyushkin et al. | |
| 2018/0103508 | A1 | 4/2018 | Matyushkin et al. | |
| 2018/0308736 | A1 * | 10/2018 | Ramaswamy | H10P 72/722 |
| 2018/0323042 | A1 * | 11/2018 | Wang | H01J 37/32642 |
| 2018/0358254 | A1 | 12/2018 | Benjamin et al. | |
| 2019/0107558 | A1 * | 4/2019 | Long | G01R 1/06772 |
| 2019/0181028 | A1 * | 6/2019 | Patel | C23C 14/505 |
| 2020/0027769 | A1 * | 1/2020 | Simmons | H10P 72/72 |
| 2020/0035535 | A1 * | 1/2020 | Parkhe | H01J 37/32458 |
| 2021/0175086 | A1 * | 6/2021 | Abhinand | H01J 37/32715 |
| 2021/0366722 | A1 * | 11/2021 | Lei | H01J 37/3244 |
| 2022/0037121 | A1 * | 2/2022 | Dorf | H01J 37/32128 |
| 2022/0108908 | A1 * | 4/2022 | Elumalai | H10P 54/00 |
| 2022/0367158 | A1 * | 11/2022 | Cui | H01J 37/32146 |
| 2023/0162955 | A1 * | 5/2023 | Parkhe | H01J 37/32724 118/723 R |
| 2023/0170192 | A1 * | 6/2023 | Guo | H01J 37/32091 156/345.28 |
| 2024/0112939 | A1 * | 4/2024 | Gnanaprakasa | H01J 37/3244 |
| 2024/0242997 | A1 * | 7/2024 | Parkhe | H01J 37/32715 |
| 2024/0249924 | A1 * | 7/2024 | Li | H01J 37/32724 |
| 2024/0258940 | A1 * | 8/2024 | Fukada | H10P 72/72 |
| 2024/0355593 | A1 * | 10/2024 | Verbaas | H01J 37/32715 |
| 2025/0054737 | A1 * | 2/2025 | Elumalai | H01J 37/32724 |
| 2025/0112075 | A1 * | 4/2025 | Sulyman | H01J 37/32724 |
| 2025/0125181 | A1 * | 4/2025 | Parkhe | H10P 72/0602 |
| 2025/0273497 | A1 * | 8/2025 | Elumalai | H01J 37/32568 |
| 2025/0273498 | A1 * | 8/2025 | Elumalai | H01J 37/32715 |

OTHER PUBLICATIONS

International Search Report and Written Opinion from PCT/US2025/013591 dated May 15, 2025, 10 pgs.

* cited by examiner

CATHODE ASSEMBLY FOR INTEGRATION OF EMBEDDED ELECTROSTATIC CHUCK (ESC)

CROSS-REFERENCE TO RELATED APPLICATIONS

This application is a continuation of U.S. patent application Ser. No. 18/586,307, filed on Feb. 23, 2024, the entire contents of which are hereby incorporated by reference herein.

BACKGROUND

1) Field

Embodiments relate to the field of semiconductor manufacturing and, in particular, to cathode assemblies with an RF feed that is electrically isolated from a DC voltage supply.

2) Description of Related Art

In semiconductor manufacturing processes, the wafer (e.g., a silicon wafer) or other substrate is coupled to a pedestal during various processes. For example, the wafer may be secured to the pedestal during plasma dicing processes, etching processes, deposition processes, and/or the like. In some embodiments, the wafer is secured to the pedestal through the use of an electrostatic chuck (ESC). The ESC provides an electrostatic force that attracts the wafer to the chuck in order to prevent movement of the wafer during processing.

Typically, the ESC is fed several inputs from an underlying cathode assembly. In existing solutions, an RF feed (for applying an RF bias) and a DC supply (for generating a chucking force) are provided to the ESC through a single input. The coupling of the RF feed and the DC supply can lead to high current leakage. For example, electrical current from the DC supply can leak into the plasma environment.

SUMMARY

Embodiments disclosed herein include an apparatus that includes an electrostatic chuck (ESC). The electrostatic chuck may include a first body that is electrically conductive, and a ceramic insert on the first body with an electrode embedded within the ceramic insert. In an embodiment, the apparatus may further include a facility plate that is coupled to the ESC. The facility plate may include a second body that is electrically conductive with a hole through the second body. In an embodiment, a DC input connector is provided through the hole, and an RF feed line is coupled to the second body. In an embodiment, a pin of the DC input connector is electrically isolated from the RF feed line.

Embodiments may further include an apparatus that includes a body with a first surface and a second surface opposite from the first surface. The body may be electrically conductive. In an embodiment, a hole is provided through the body, and an input connector is inserted through the hole. In an embodiment, the input connector comprises a pin that is electrically conductive and a collar around the pin that is electrically insulating. In an embodiment, the apparatus further comprises an electrically conductive feed line contacting the body.

Embodiments may also comprise a semiconductor processing tool that includes a chamber suitable for maintaining a vacuum environment within the chamber. In an embodiment, the tool may also include a cathode assembly within the chamber. The cathode assembly may include an electrostatic chuck (ESC) and a facility plate. In an embodiment, the ESC includes a first body that is electrically conductive, and a ceramic insert on the first body, with an electrode embedded within the ceramic insert. In an embodiment, the facility plate is coupled to the ESC, and includes a second body that is electrically conductive, a hole through the second body, a DC input connector through the hole, and an RF feed line coupled to the second body. In an embodiment, a pin of the DC input connector is electrically isolated from the RF feed line.

DETAILED DESCRIPTION

Figure 1A:
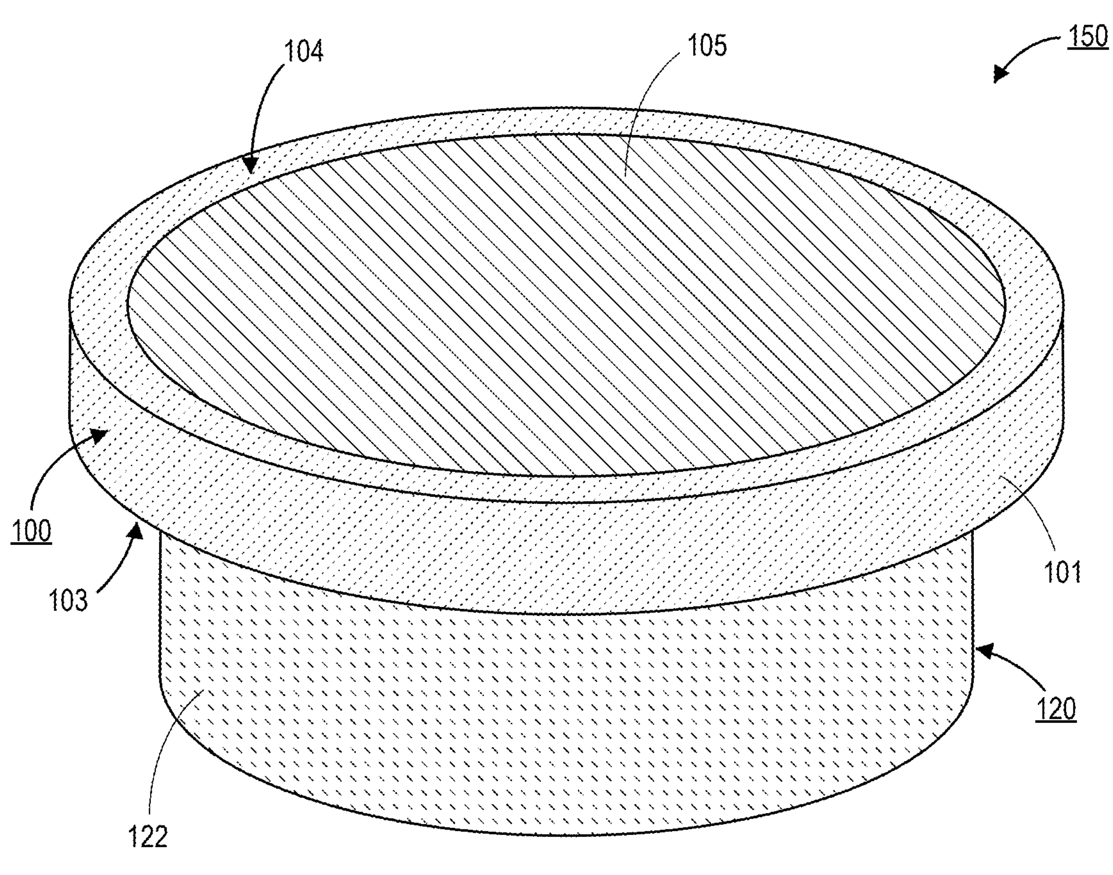
FIG. 1A is a perspective view illustration of a cathode assembly, in accordance with an embodiment.

Embodiments described herein include apparatuses and methods for using a cathode assembly with an RF feed that is electrically isolated from a DC voltage supply. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Various embodiments or aspects of the disclosure are described herein. In some implementations, the different embodiments are practiced separately. However, embodiments are not limited to embodiments being practiced in isolation. For example, two or more different embodiments can be combined together in order to be practiced as a single device, process, structure, or the like. The entirety of various embodiments can be combined together in some instances. In other instances, portions of a first embodiment can be combined with portions of one or more different embodiments. For example, a portion of a first embodiment can be combined with a portion of a second embodiment, or a portion of a first embodiment can be combined with a portion of a second embodiment and a portion of a third embodiment.

The embodiments illustrated and discussed in relation to the figures included herein are provided for the purpose of explaining some of the basic principles of the disclosure. However, the scope of this disclosure covers all related, potential, and/or possible, embodiments, even those differing from the idealized and/or illustrative examples presented. This disclosure covers even those embodiments which incorporate and/or utilize modern, future, and/or as of the time of this writing unknown, components, devices, systems, etc., as replacements for the functionally equivalent, analogous, and/or similar, components, devices, systems, etc., used in the embodiments illustrated and/or discussed herein for the purpose of explanation, illustration, and example.

As noted above, existing electrostatic chuck (ESC) structures are susceptible to significant current leakage. That leakage may result from the current (e.g., DC or RF) leaking away from the ESC and coupling with the plasma within a chamber and/or otherwise escaping through other electrical pathways. One problem with leakage is that chucking force is difficult to control. In some instances, current leakage during a processing operation within the chamber may result in dechucking of the wafer. That is, the chucking force dips below a given threshold, and the wafer becomes free to move, bend, or otherwise displace relative to the surface of the ESC. This movement is detrimental because the processing conditions are highly tuned, and the movement may result in non-uniform treatment of the wafer or damage to the wafer or ESC.

To prevent dechucking, the wafer is often "overchucked" so that the chucking force is increased beyond what would otherwise be necessary. This can lead to damage to the wafer and/or damage to the ESC itself. For example, an overchucked wafer can be cracked, chipped, deformed, or otherwise damaged. Overchucking may also lead to excessive wear on the ESC. This may require more frequent repair, replacement, and/or refurbishing of the ESC. As such, the leakage current can lead to increases in cost of ownership of a semiconductor processing tool, and/or an increase in manufacturing costs due to damaged wafers. The presence of leakage current also reduces the efficiency of the system. That is, more energy is needed in order to run a given process when overchucking is necessary to account for leakage. This also increases costs and can generate environmental impact issues.

Referring now to FIG. 1A, a perspective view illustration of a cathode assembly 150 is shown, in accordance with an embodiment. In an embodiment, the cathode assembly 150 may comprise a facility plate 120 and an ESC 100. The facility plate 120 is an interface layer that is used to mechanically couple the ESC 100 to the rest of the chamber or tool (not shown in FIG. 1A). The facility plate 120 can function as an adapter to enable electrical coupling to the ESC 100 and/or to enable fluidic coupling (e.g., for backside gas flow).

In an embodiment, the ESC 100 may comprise a first body 101. The body 101 may be an electrically conductive material. For example, the first body 101 may comprise aluminum, or the like. The first body 101 may have a first surface 103 (e.g., a bottom surface) and a second surface 104 (e.g., a top surface) opposite from the bottom surface. In an embodiment, the body has a cylindrical shape that is suitable for supporting a wafer, such as a standard silicon wafer. For example, a diameter of the first body 101 may be at least 200 mm or larger, at least 300 mm or larger, at least 450 mm or larger, or at least 750 mm or larger.

In an embodiment, a ceramic plate 105 may be provided on the second surface 104 of the body 101. The ceramic plate 105 may be set into a recess of the second surface 104 so that the top surface of the ceramic plate 105 is substantially coplanar with a top surface of the first body 101. Though, in other embodiments, the ceramic plate 105 may have a top surface above or below the top surface of the first body 101.

In an embodiment, the ceramic plate 105 may comprise an electrically conductive electrode (not visible in FIG. 1A). The electrode may be embedded within a thickness of the ceramic plate 105. The electrode is coupled to a DC input in order to generate a chucking force that attracts and secures a wafer (not shown) to the ceramic plate 105. In an embodiment, the ceramic plate may comprise any suitable material, such as aluminum nitride, aluminum oxide, or the like.

In an embodiment, the facility plate 120 may comprise a second body 122. The second body 122 may also be electrically conductive. The second body 122 may be the same material as the first body 101. For example, the second body 122 may comprise aluminum or the like. In some embodiments, a link 123 may be provided between the first body 101 and the second body 122. The link 123 may be a bolt, a screw, a pin, or the like. In some embodiments, the link 123 is electrically conductive. As such, the link 123 may provide electrical coupling between the facility plate 120 and the ESC 100. The link 123 may also provide mechanical coupling between the facility plate 120 and the ESC 100.

In an embodiment, the facility plate 120 may have a diameter that is smaller than a diameter of the ESC 100. Though, in other embodiments, the facility plate 120 may have a diameter that is substantially equal to a diameter of the ESC 100, or the facility plate 120 may have a diameter that is greater than a diameter of the ESC 100.

Figure 1B:
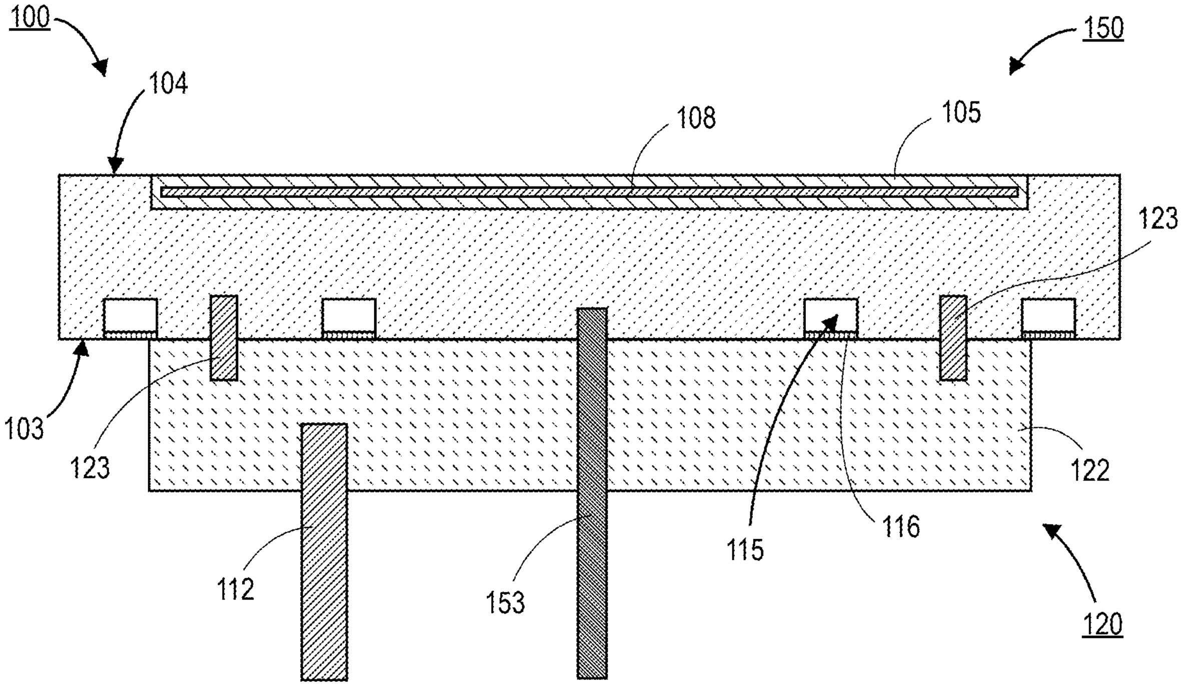
FIG. 1B is a cross-sectional illustration of a cathode assembly with a single input for the RF feed and the DC input, in accordance with an embodiment.

Referring now to FIG. 1B, a cross-sectional illustration of the cathode assembly 150 in FIG. 1A is shown, in accordance with an embodiment. As shown, the ceramic plate 105 in the ESC 100 is set into a recess along the second surface 104 of the body 101. The ceramic plate 105 may also comprise an electrode 108. The electrode 108 may be an electrically conductive material, such as copper or the like. The electrode 108 may be a conductive plate, a conductive mesh, or have any other conductive pattern that is distributed though the ceramic plate 105. In the illustrated embodiment, the electrode 108 is set at a midpoint along a thickness direction of the ceramic plate 105. Though, in other embodiments the electrode 108 may be closer to a top of the ceramic plate 105 or closer to a bottom of the ceramic plate 105. When the electrode 108 is embedded within the ceramic plate 105 as shown in FIG. 1B, the ESC 100 may sometimes be referred to as an embedded ESC 100.

In an embodiment, the electrode 108 may be electrically coupled to an input 112. For example, the input 112 may be in electrical contact with the second body 122 of the facility plate 120, and the links 123 may electrically couple the second body 122 to the first body 101 of the ESC 100. The first body 101 may be electrically coupled to the electrode 108 through a via or other contact (not shown) that passes through the ceramic plate 105. In this way, a DC bias may be applied from the input 112 to the electrode 108 in order to provide a chucking force.

At the same time, the input 112 may also receive an RF signal that is transferred to the second body 122 of the facility plate 120 and the first body 101 of the ESC 100 (through the links 123). This allows for an RF bias to be applied to the ESC 100 which may be used during processing operations. Since the DC input and the RF feed are not electrically isolated from each other, leakage is more prevalent in the cathode assembly 150 compared to embodiments that will be described in greater detail herein. This may lead to issues with dechucking, excessive energy consumption, and/or the like.

In an embodiment, the ESC 100 may also comprise fluidic channels 115. The fluidic channels 115 may be provided at a bottom of the ESC 100 and sealed with a lid 116. The fluidic channels 115 may be suitable for flowing gas and/or liquid within the body 101. This can be used for cooling or other thermal control of the ESC 100. In the illustrated embodiment, a single gas input 153 is coupled to the ESC 100 in order to distribute gas into the fluidic channels 115.

As described above, the cathode assembly 150 in FIGS. 1A and 1B suffers from current leakage due to the combined input 112 for the DC current and RF current. Accordingly, embodiments disclosed herein may include an ESC that has a DC input line that is separate from the RF feed. More particularly, the DC voltage applied to the electrode within the ceramic plate can be electrically isolated from the conductive bodies of the facility plate and the ESC. Similarly, the RF feed can be provided directly to the conductive body of the ESC without being superimposed on the DC input line. Due to the electrical isolation, the leakage current can be reduced.

Additionally, embodiments disclosed herein provide enhanced thermal control through the use of a dual zone gas delivery system. In an embodiment, the gas delivery through the facility plate is designed in order to accommodate the gas input locations of the ESC. That is, the ESC does not require any redesign in order to route a dual gas zone solution to the ESC.

Figure 2A:
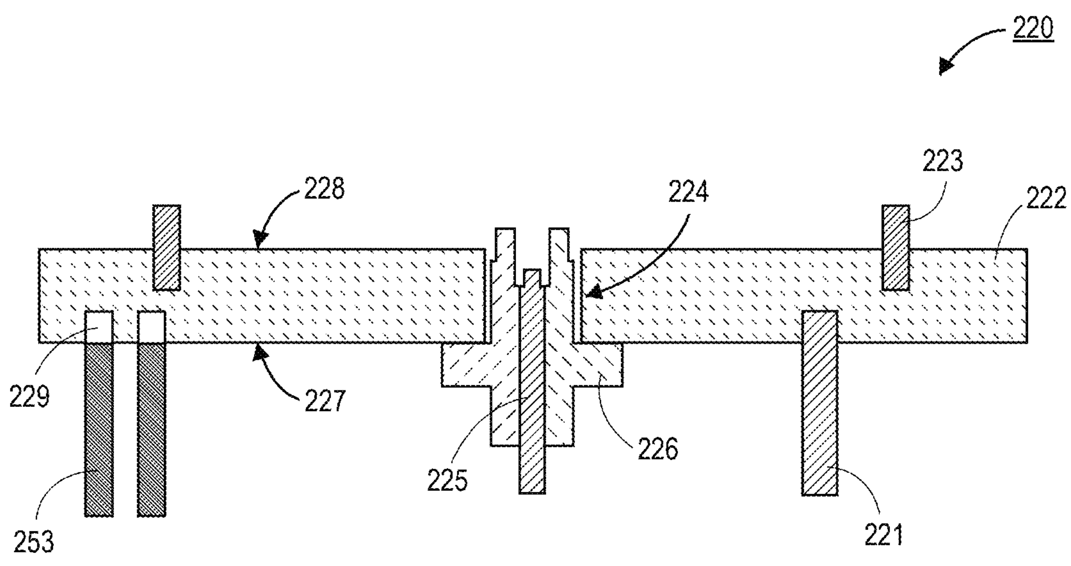
FIG. 2A is a cross-sectional illustration of a facility plate with a DC input that is electrically isolated from an RF feed, in accordance with an embodiment.

Referring now to FIG. 2A, a cross-sectional illustration of a facility plate 220 is shown, in accordance with an embodiment. In an embodiment, the facility plate 220 may comprise an electrically conductive body 222. The electrically conductive body 222 may comprise aluminum or another metallic material. In an embodiment, a hole 224 may pass through a thickness of the facility plate 220. The hole 224 may be provided at an approximate center of the facility plate 220. Though, the hole 224 may be provided at other locations, depending on the overall design of the cathode assembly. The hole 224 may be sized to receive a DC input connector. The DC input connector may be a high voltage connector that will ultimately be electrically coupled to the electrode of the ESC (not shown in FIG. 2B). In an embodiment, the DC input connector may comprise a pin 225 that is electrically conductive. The DC input connector may further comprise an electrically insulating collar 226. The electrically insulating collar 226 electrically isolates the pin 225 from the electrically conductive body 222 of the facility plate 220.

In an embodiment, the facility plate 220 may be coupled to an RF feed line 221. The RF feed line 221 may directly contact the body 222. In other instances, an intervening electrically conductive structure may be provided between the RF feed line 221 and the body 222. Electrical isolation between the pin 225 and the body 222 (which may be provided by collar 226) allows for the body 222 to be biased with an RF bias without DC voltage/current from the pin 225 of the DC input connector leaking into the body 222. That is, RF and DC are completely isolated from each other through the facility plate 220.

In an embodiment, the facility plate 220 may further comprise links 223. The links 223 may extend up from the body 222. The links 223 may be a bolt, a screw, a pin, or the like. In some embodiments, the links 223 are electrically conductive. As such, the links 223 may provide electrical coupling between the facility plate 220 and an ESC (not shown in FIG. 2A). The links 223 may also provide mechanical coupling between the facility plate 220 and the ESC.

In an embodiment, the facility plate 220 may also comprise a fluidic path 229 between a first surface 227 and a second surface 228. In the illustrated embodiment, a pair of fluidic paths 229 are shown to enable dual zone gas delivery. Though, a single fluidic path 229 or two or more fluidic paths 229 may be provided in the facility plate 220 in other embodiments. Gas inputs 253 may provide gas to the fluidic paths 229.

The fluidic paths 229 in FIG. 2A have an opening at the first surface 227, but the opening at the second surface 228 is not visible. This is because the opening at the second surface 228 is out of the plane of FIG. 2A. As will be described in greater detail below, a horizontal channel may fluidically couple the entrance and exit to the fluid paths 229. This allows for routing of the fluidic path 229 in order to accommodate existing ESC designs.

Figure 2B:
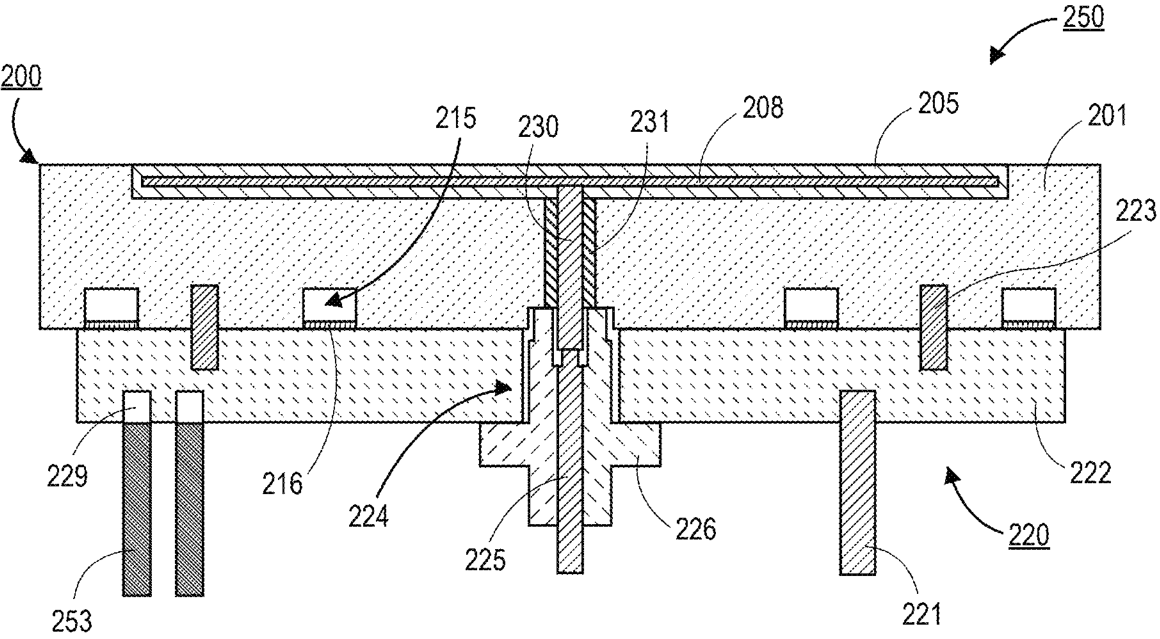
FIG. 2B is a cross-sectional illustration of a cathode assembly with an electrostatic chuck (ESC) and a facility plate, in accordance with an embodiment.

Referring now to FIG. 2B, a cross-sectional illustration of a cathode assembly 250 is shown, in accordance with an embodiment. In an embodiment, the cathode assembly 250 may comprise a facility plate 220 that is similar to the facility plate 220 in FIG. 2A and an ESC 200. In an embodiment, the ESC 200 may be coupled to the facility plate 220 by one or more links 223. As noted above, the links 223 may provide electrical and mechanical coupling between the ESC 200 and the facility plate 220. For example, the RF feed line 221 may provide an RF bias to the facility plate 220 that can be transferred to a body 201 of the ESC 200 by the links 223.

In an embodiment, the ESC 200 may also comprise a ceramic plate 205. The ceramic plate 205 may include an embedded electrode 208. The electrode 208 may be electrically coupled to the DC input connector by a pin 230 that passes through the body 201 of the ESC 200. In an embodiment, the pin 230 may be surrounded by an electrically insulating collar 231. This maintains the electrical isolation between the DC bias and the RF bias for the cathode assembly 250. In an embodiment, the pin 230 may be electrically coupled to the pin 225 in the facility plate 220. For example, in FIG. 2B the pin 230 and the pin 225 directly contact each other. In other embodiments, one or more intervening electrically conductive components may be provided between the pin 225 and the pin 230.

The ESC 200 may further comprise fluidic channels 215. The fluidic channels 215 may be provided at a bottom of the ESC 200 and sealed with a lid 216. The fluidic channels 215 may be suitable for flowing gas and/or liquid within the body 201. This can be used for cooling or other thermal control of the ESC 200. In an embodiment, the fluidic channels 215 may be fluidically coupled to the fluidic paths 229 in the facility plate 220 (through a connection out of the plane of FIG. 2B). In some embodiments, the fluidic channels 215 may comprise a multi-zone configuration. That is, a first fluidic channel 215 may provide an outer zone for backside gas and a second fluidic channel 215 may provide an inner zone for backside gas.

Figure 3A:
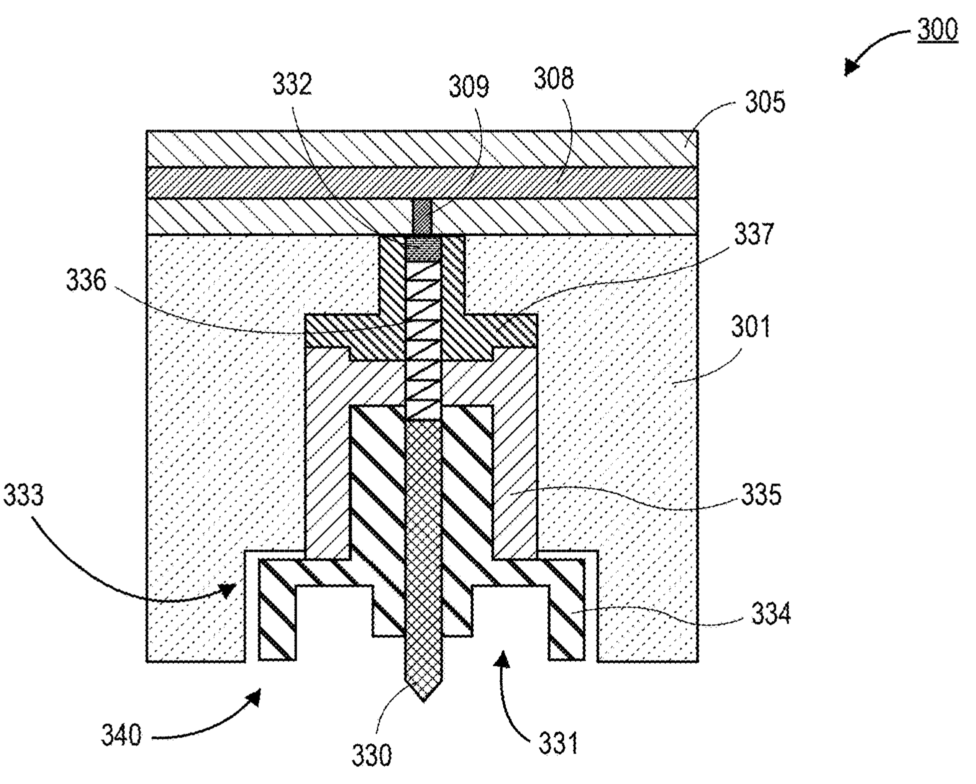
FIG. 3A is a zoomed in cross-sectional illustration of the DC input that is electrically isolated from the metallic body of the ESC, in accordance with an embodiment.

Referring now to FIG. 3A, a zoomed in illustration of a DC input assembly 340 inserted into a hole 333 of an ESC 300 is shown, in accordance with an embodiment. In an embodiment, the DC input assembly 340 may comprise an electrically conductive rod 330 that is electrically coupled to a DC input 332 by an electrically conductive spring 336. The DC input 332 may be an electrically conductive pad, pin, or the like. The DC input 332 may be electrically coupled to the electrode 308 in the ceramic plate 305 by a via 309 or the like.

In an embodiment, the rod 330, the spring 336, and the DC input 332 may be surrounded by an electrically insulating collar 334, 335, and 337 to prevent electrical shorting to the body 301. The collar 334, 335, and 337 is shown as being three distinct parts. In other embodiments, a single electrically insulating component can be used as the collar, or a plurality of components can be coupled together to form the collar. As such, a direct and isolated path from the conductive rod 330 to the electrode 308 can be made in order to apply a DC bias to the electrode 308 for generating a chucking force on a substrate (not shown in FIG. 3A).

In an embodiment, the design of the DC input assembly 340 may take into consideration assembly processes. For example, the ESC 300 is often attached to the underlying facility plate (not shown in FIG. 3A) with a blind install. As such, the ability to provide alignment tolerance is beneficial in order to make assembly easier. In some instances, a portion of the collar 334 may include a recess 331 in order to accommodate a connector for the facility plate. The recess 331 may be a ring shaped recess along the bottom surface of the collar 334 that surrounds the rod 330.

The presence of the spring 336 may also be beneficial for the assembly process. Particularly, the spring 336 provides a compressible member that allows for any variation in the placement of the ESC 300 in the Z-dimension to be accommodated. For example, if the ESC 300 is set too "high" the spring 336 expands to provide the proper electrical connection to the electrode 308. Similarly, if the ESC 300 is set too "low" the spring 336 compresses in order reduce the height of the DC input line.

Figure 3B:
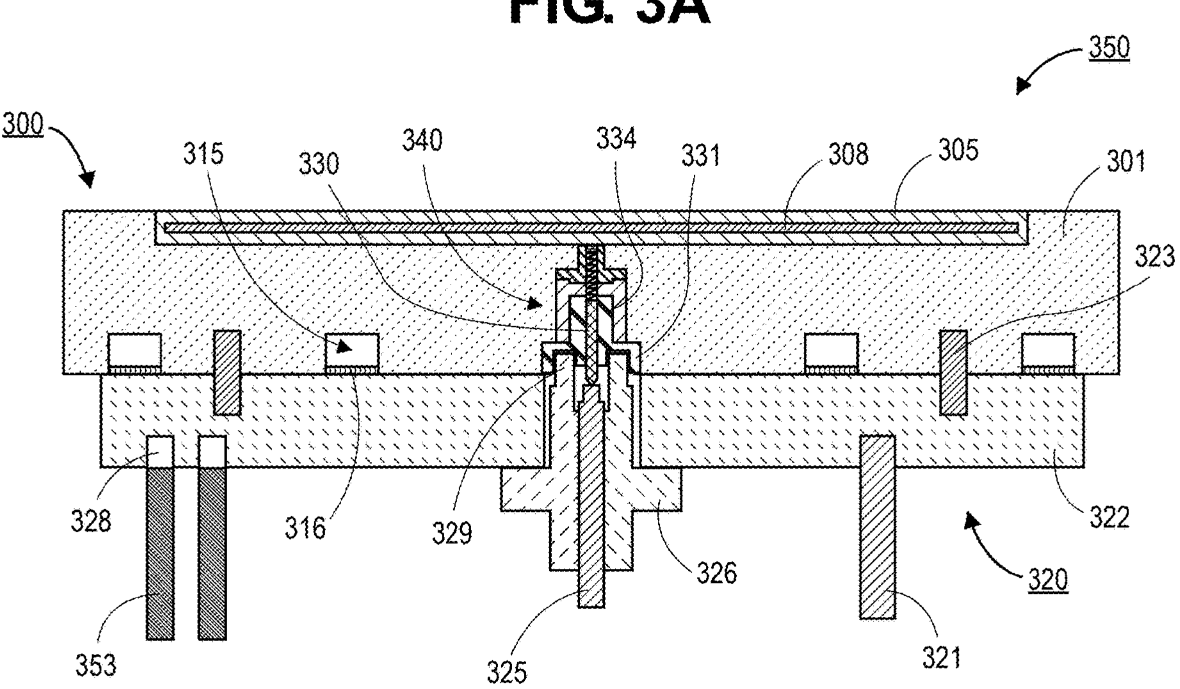
FIG. 3B is a cross-sectional illustration of a cathode assembly with an ESC and a facility plate with a DC input that is electrically isolated from an RF feed, in accordance with an embodiment.

Referring now to FIG. 3B, a cross-sectional illustration of a cathode assembly 350 with an ESC 300 that is coupled to a facility plate 320 is shown, in accordance with an embodiment. In an embodiment, the facility plate 320 is part of the larger pedestal structure on which the ESC 300 is attached. The facility plate 320 may be an interface structure that allows for the DC input assembly 340 and the RF feed 321 to be passed to regions underlying the ESC 300 and out of the chamber (not shown).

In an embodiment, the facility plate 320 may comprise a body 322 that is a metallic material, such as aluminum or the like. In an embodiment, a hole may pass through the facility plate 320 below the DC input assembly 340. In an embodiment, a DC input connector may pass through the hole in the facility plate 320. The DC input connector may comprise an electrically insulating housing or collar 326 that surrounds a pin 325. The pin 325 may be electrically coupled to the pin 330 of the DC input assembly 340. In some embodiments, the pin 325 directly contacts the pin 330. In other embodiments, one or more intervening electrically conductive structures are provided between the pin 325 and the pin 330.

In an embodiment, collar 326 may comprise a protrusion 329 at an upper edge of the collar 326. The protrusion 329 may be a ring-shaped protrusion that surrounds a perimeter of the pin 325. The protrusion 329 may be sized to insert into the recess 331 of the collar 326 of the DC input assembly 340. The protrusion 329 and recess 331 interface may be used in order to align the ESC 300 to the facility plate 320 when a blind install or assembly is used.

In an embodiment, the RF feed 321 passes through the facility plate 320 as well. In other embodiments, the RF feed 321 may be electrically coupled to the body 301 of the ESC 300 through links 323. Since the pins 325 and 330 are electrically isolated from the conductive bodies 322 and 301, the DC component and the RF component of the cathode assembly 350 do not interact with each other.

In an embodiment, the cathode assembly 350 may also be configured to provide a backside gas supply. For example, gas inputs 353 may supply gas to fluidic channels 328 in the facility plate 320, and the fluidic channels 328 may be fluidically coupled to the fluidic channels 315 that are sealed by a lid 316 in the ESC 300. The backside gas supply may be separated into two or more zones in some embodiments. For example, an outer zone and an inner zone may be supplied in some embodiments.

Referring now to FIGS. 4A-4E a series of illustrations depicting a process for forming the fluidic channels within a facility plate 420 is shown, in accordance with an embodiment. In the illustrated embodiment, a single channel is shown for illustrative purposes. However, other embodiments may include two or more channels in order to provide a multi-zone gas distribution system. The channel generated in the facility plate 420 allows for the gas inlet to be routed to a different position in the X-Y plane. This allows for existing gas feed lines and existing ESC designs to be used without the need for redesign. That is, the facility plate 420 reroutes the gas flow path to join a gas feed line to an ESC gas input.

Figure 4A:
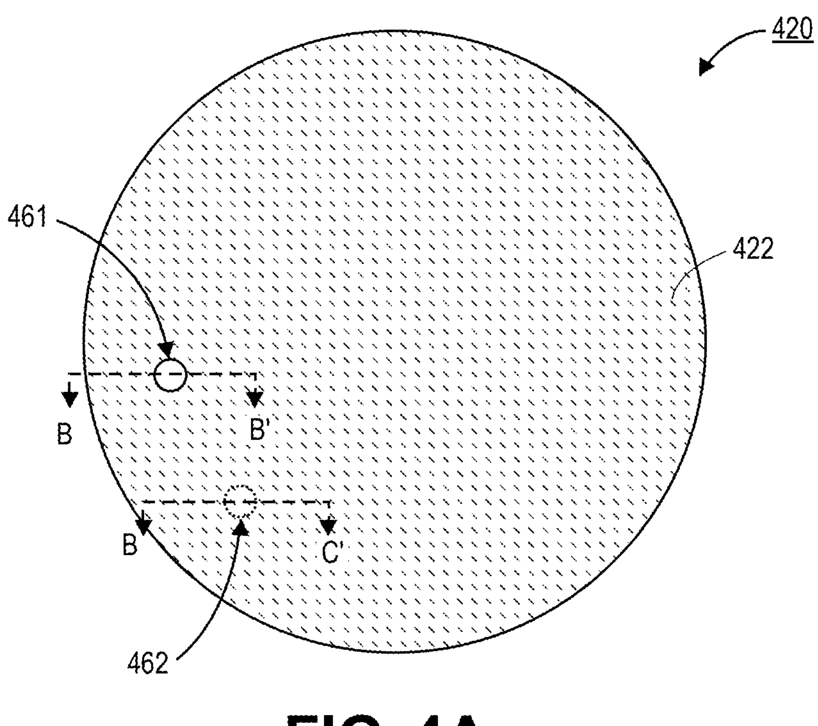
FIGS. 4A-4E are illustrations depicting a process for relocating a gas pathway through a facility plate, in accordance with an embodiment.

Referring now to FIG. 4A, a plan view illustration of a facility plate 420 is shown, in accordance with an embodiment. The facility plate 420 may comprise a body 422, such as an aluminum body 422. In FIG. 4A, only the gas distribution components are shown. Other holes, features, and/or the like are omitted for simplicity. As shown, a first vertical portion 461 and a second vertical portion 462 are formed in the facility plate 420. The first vertical portion 461 is offset (in the X-Y plane) from the second vertical portion 462.

Figure 4B:
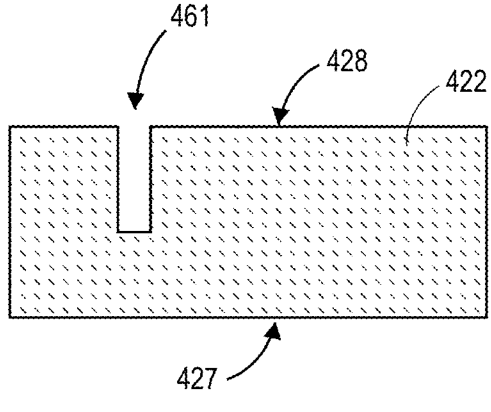
Figure 4B:
Figure 4C:
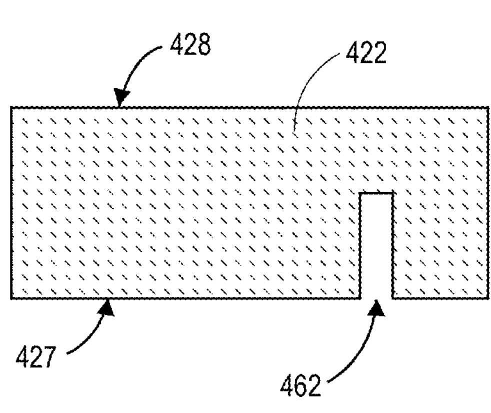

FIG. 4B is a cross-sectional illustration of a portion of the facility plate 420 along line B-B' in FIG. 4A. As shown, the first vertical portion 461 passes into the top surface 428 of the body 422. However, the first vertical portion 461 does not extend entirely through a thickness of the body 422 in some embodiments. FIG. 4C is a cross-sectional illustration of a portion of the facility plate 420 along line C-C' in FIG. 4A. As shown, the second vertical portion 462 passes into the bottom surface 427 of the body 422. In some instances, the second vertical portion 462 does not extend entirely through a thickness of the body 422. In an embodiment, the first vertical portion 461 and the second vertical portion 462 may overlap each other in the Z-dimension.

Figure 4D:
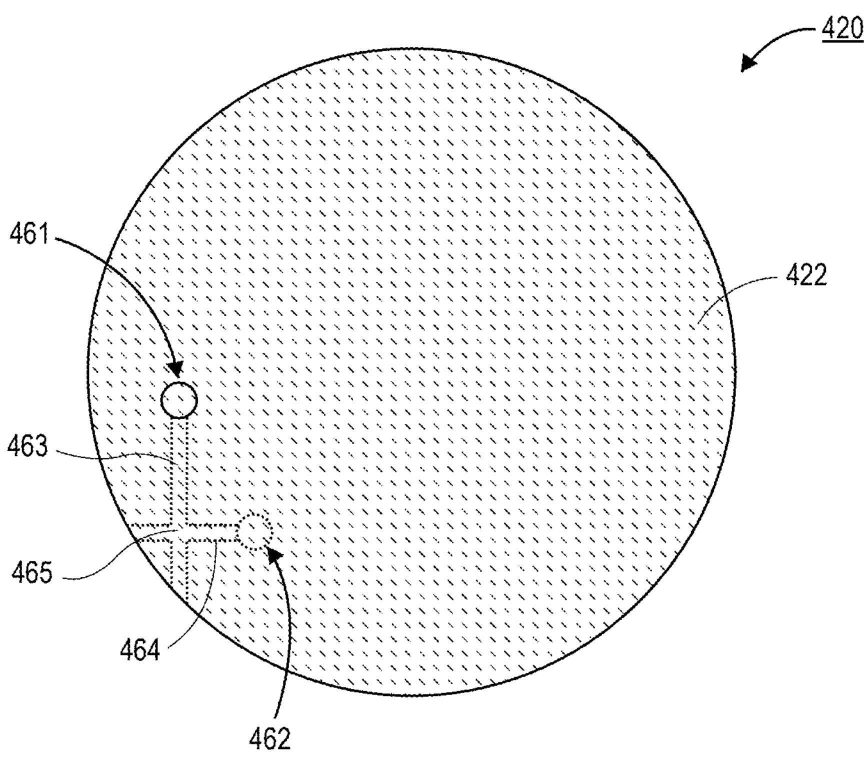

Referring now to FIG. 4D, a plan view illustration of the facility plate 420 after a horizontal channel that fluidically couples the first vertical portion 461 to the second vertical portion 462 is formed is shown, in accordance with an embodiment. In an embodiment, the horizontal channel may comprise a first horizontal portion 463 that extends from an edge of the first vertical portion 461 to an edge of the body 422 and a second horizontal portion 464 that extends from the second vertical portion 462 to the edge of the body 422. The first horizontal portion 463 and the second horizontal portion 464 may be formed at a similar Z-height so that they intersect at a point 465. The first horizontal portion 463 and the second horizontal portion 464 may be formed with a drilling operation or the like.

Figure 4E:
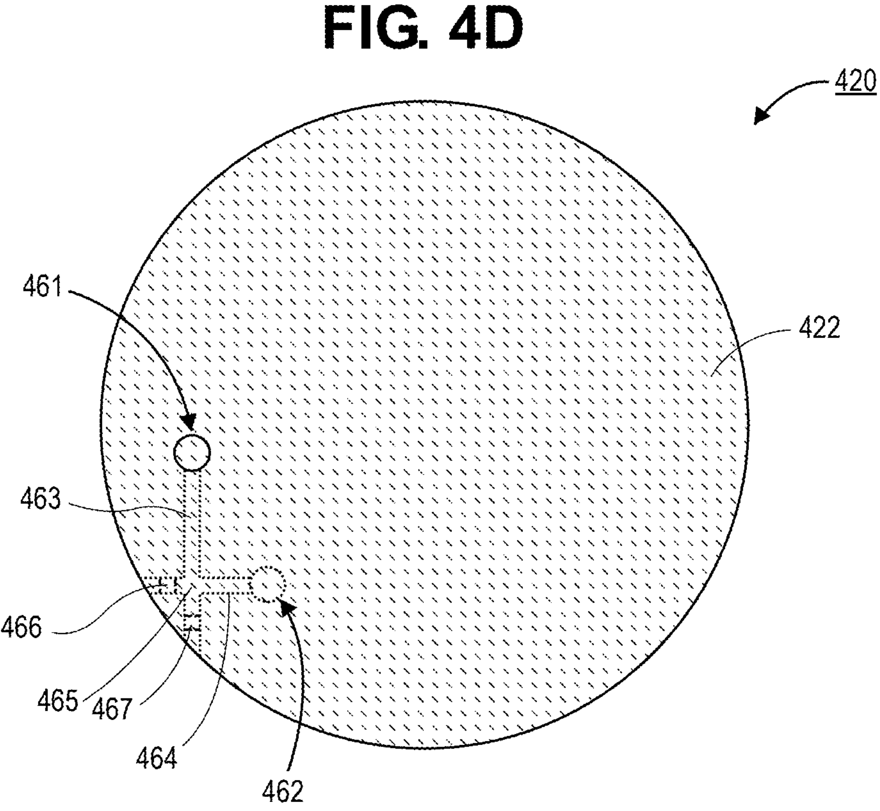

Referring now to FIG. 4E, a plan view illustration of the facility plate 420 after plugs 466 and 467 are inserted into the horizontal channel. The plug 466 may be positioned between the intersection point 465 and the edge of the body 422 along the second horizontal portion 464, and the plug 467 may be positioned between the intersection point 465 and the edge of the body 422 along the first horizontal portion 463. The plugs 466 and 467 seal the horizontal channel so that the fluidic path proceeds from the first vertical portion 461 to the second vertical portion 462 without leaking out an edge of the body 422.

Figure 4F:
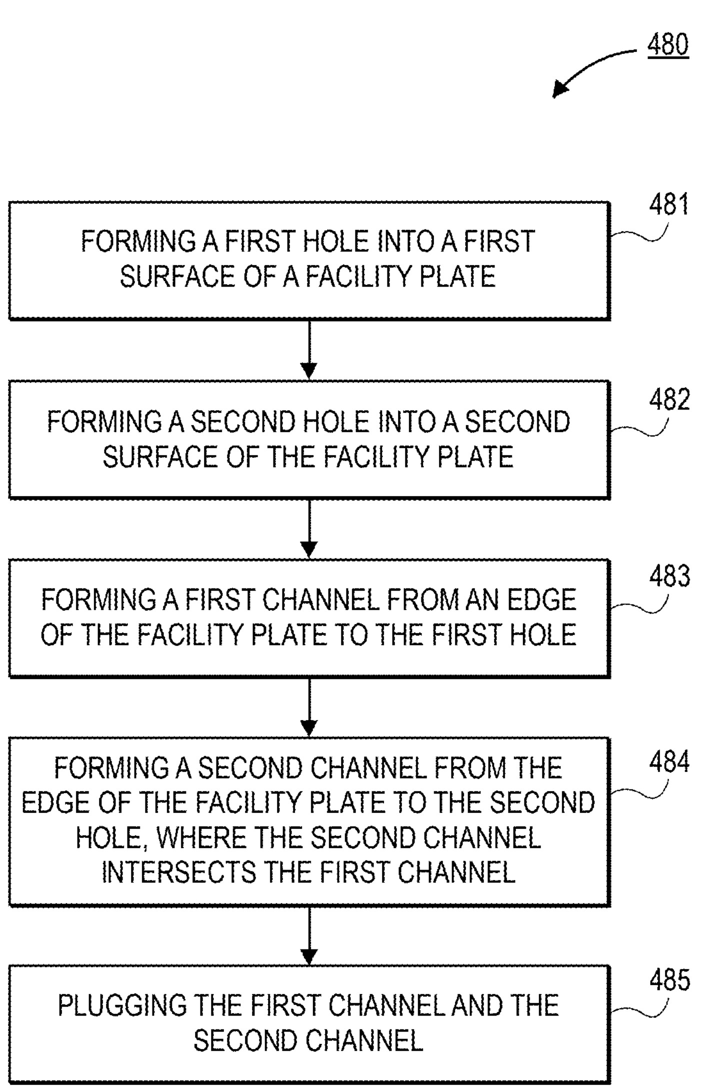
FIG. 4F is a process flow diagram of a process for forming a gas pathway through a facility plate, in accordance with an embodiment.

Referring now to FIG. 4F, a process flow diagram of a process 480 for forming a fluidic path within a facility plate is shown, in accordance with an embodiment. The process 480 may result in a facility plate that is similar in structure to the facility plate 420 shown in FIG. 4E.

In an embodiment, the process 480 may begin with operation 481, which comprises forming a first hole into a first surface of a facility plate. The first hole may be formed with a drilling operation or the like. The first hole may pass partially through a thickness of the facility plate. In an embodiment, the process 480 may continue with operation 482, which comprises forming a second hole into a second surface of the facility plate. The second hole may be formed with a drilling operation or the like. The second hole may pass partially through a thickness of the facility plate. In an embodiment, the first hole and the second hole may be offset from each other in the X-Y plane. Additionally, a portion of the first hole may overlap a portion of the second hole in the Z-direction.

In an embodiment, the process 480 may continue with operation 483, which comprises forming a first channel from an edge of the facility plate to the first hole. The first channel may be formed with a drilling process or the like. In an embodiment, the process 480 may continue with operation 484, which comprises forming a second channel from the edge of the facility plate to the second hole. In an embodiment, the second channel intersects the first channel. The second channel may be formed with a drilling process or the like.

In an embodiment, the process 480 may continue with operation 485, which comprises plugging the first channel and the second channel. For example, plugs may be provided in the first channel and the second channel between a point of intersection of the channels and the edge of the facility plate. Accordingly, a fluidic path may be provided that starts by going into the first hole, continuing along the first channel, then passing into the second channel, and ultimately out of the second hole.

Figure 5:
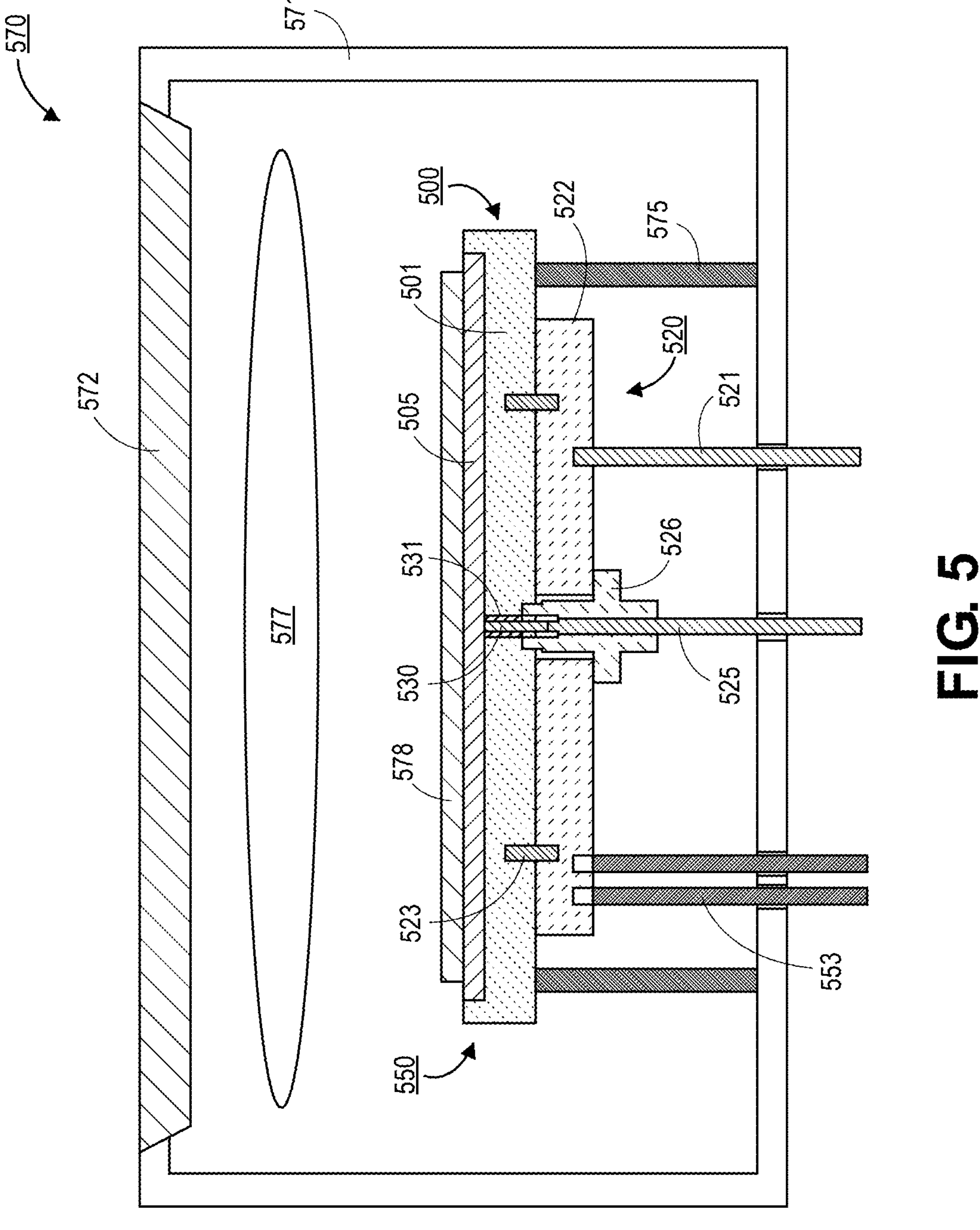
FIG. 5 is cross-sectional illustration of a semiconductor processing tool that comprises a cathode assembly with a DC input that is electrically isolated from an RF feed, in accordance with an embodiment.

Referring now to FIG. 5, a cross-sectional illustration of a semiconductor processing tool 570 is shown, in accordance with an embodiment. In an embodiment, the semiconductor processing tool 570 may include a plasma processing tool, such as a plasma etching chamber, a plasma dicing chamber, a deposition chamber that uses plasma (e.g., plasma enhanced chemical vapor deposition (PECVD) or plasma enhanced atomic layer deposition (PEALD), etc.), a plasma treatment chamber, or the like.

In an embodiment, the tool 570 may comprise a chamber 571. The chamber 571 may be suitable for supporting a vacuum pressure within the chamber 571 in order to support the generation of a plasma 577. In an embodiment, the chamber 571 may comprise a cathode assembly 550 that is supported over a pedestal 575. The interior of the pedestal 575 is omitted for simplicity.

In an embodiment, the cathode assembly 550 may be similar to any of the cathode assemblies described in greater detail herein. For example, the cathode assembly 550 may comprise an ESC 500 that is coupled to a facility plate 520. In an embodiment, the ESC 500 may comprise a metallic body 501 with a ceramic plate 505 on a top surface of the metallic body 501. A DC input pin 530 may pass through a hole in the body 501, and an electrically insulating collar 531 may electrically isolate the DC input pin 530 from the body 501. The facility plate 520 may also comprise a metallic body 522 with a hole to pass a high voltage DC connector. The high voltage DC connector may comprise a pin 525 surrounded by an electrically insulating collar 526. The pin 525 may be electrically coupled to the DC input pin 530 of the ESC 500. The collar 526 electrically isolates the pin 525 from the body 522 of the facility plate 520.

In an embodiment, an RF feed 521 may be electrically coupled to the body 522 of the facility plate 520. The RF bias applied to the body 522 by the RF feed line 521 can be coupled to the body 501 of the ESC 500 through links 523 or the like. Accordingly, the ESC 500 and the facility plate 520 both provide inputs for DC and RF that are electrically isolated from each other. This reduces leakage and can improve tool 570 performance. For example, chucking force applied to a substrate 578 can be reduced compared to existing solutions where the RF and DC inputs are superimposed on each other. In an embodiment, the substrate 578 may be chucked to the ESC 500 through the use of the DC input 530 that is coupled to an electrode (not shown) in the ceramic plate 505. The substrate 578 may be a wafer (e.g., a silicon wafer) or any other type of substrate used in a semiconductor processing environment.

In an embodiment, gas feed lines 553 may be provided to the facility plate 520. The gas feed lines 553 may provide gas to the facility plate 520 and the ESC 500 to enable backside gas delivery for thermal control purposes. In some embodiments, multiple gas feed lines 553 are used to provide multi-zone control. Additionally, the facility plate 520 may include fluidic channels that reroute the gas path to accommodate any input position for gas into the ESC 500.

In an embodiment, a showerhead 572 may be provided as a lid to the chamber 571 that is opposite from the ESC 500. Processing gasses may be flown into the chamber 571 through the showerhead 572. The showerhead 572 may be biased with RF or microwave frequencies in order to ignite the plasma 577 within the chamber 571.

Figure 6:
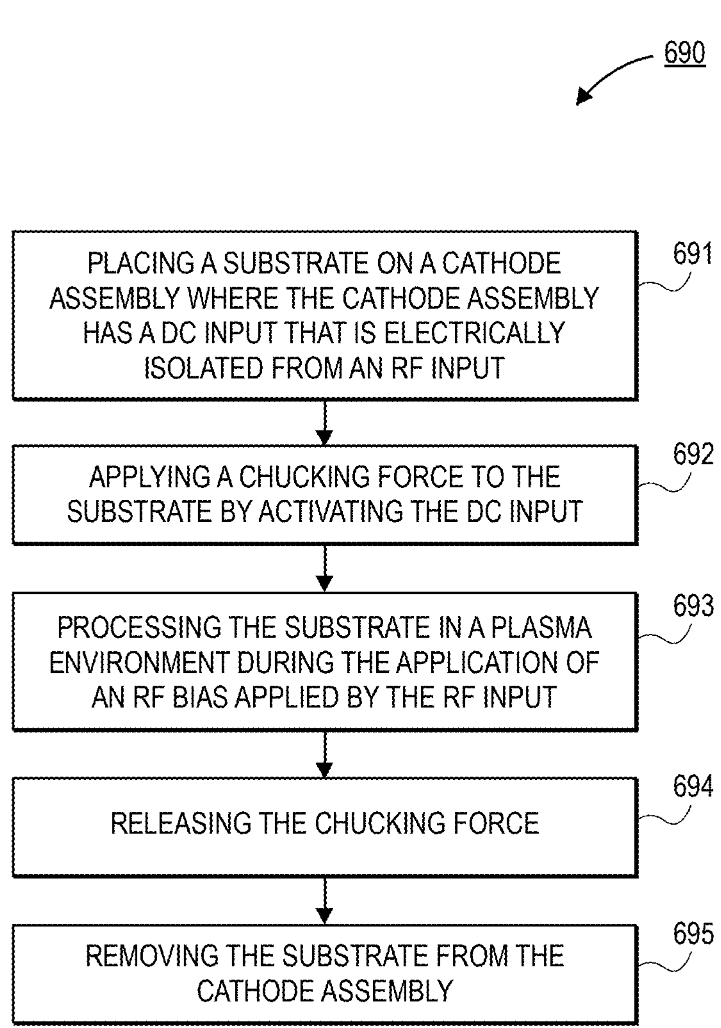
FIG. 6 is a process flow diagram of a method for processing a substrate with a cathode assembly that comprises a DC input that is electrically isolated from an RF feed, in accordance with an embodiment.

Referring now to FIG. 6, a process flow diagram of process 690 for processing a substrate with a semiconductor tool that includes a cathode assembly with a DC input that is electrically isolated from an RF input is shown, in accordance with an embodiment. In an embodiment, the process 690 begins with operation 691, which comprises placing a substrate on a cathode assembly, where the cathode assembly has a DC input that is electrically isolated from an RF input. The cathode assembly used in process 690 may be similar to any of the cathode assemblies described in greater detail herein.

In an embodiment, the process 690 may continue with operation 692, which comprises applying a chucking force to the substrate by activating the DC input. Since the DC input is electrically isolated from a remainder of the cathode assembly, the chucking force needed to secure the substrate is reduced compared to existing ESC devices. This also allows for lower current leakage and provides a more efficient tool.

In an embodiment, the process 690 may continue with operation 693, which comprises processing the substrate in a plasma environment during an application of an RF bias applied by the RF input. In an embodiment, the processing may include a plasma etching process, a plasma dicing process, or any other treatment process. In an embodiment, the chucking force to the substrate remains substantially constant during the processing of the substrate. Since there is substantially no leakage, the uniform chucking force can be maintained without changing a DC voltage of the DC input.

In an embodiment, the process 690 may continue with operation 694, which comprises releasing the chucking force. In an embodiment, the chucking force may be released by reducing a voltage of the DC input. After the chucking force is released, the process 690 may continue with operation 695. Operation 695 may comprise removing the substrate from the ESC. The substrate may be removed by a wafer handling robot or the like.

Figure 7:
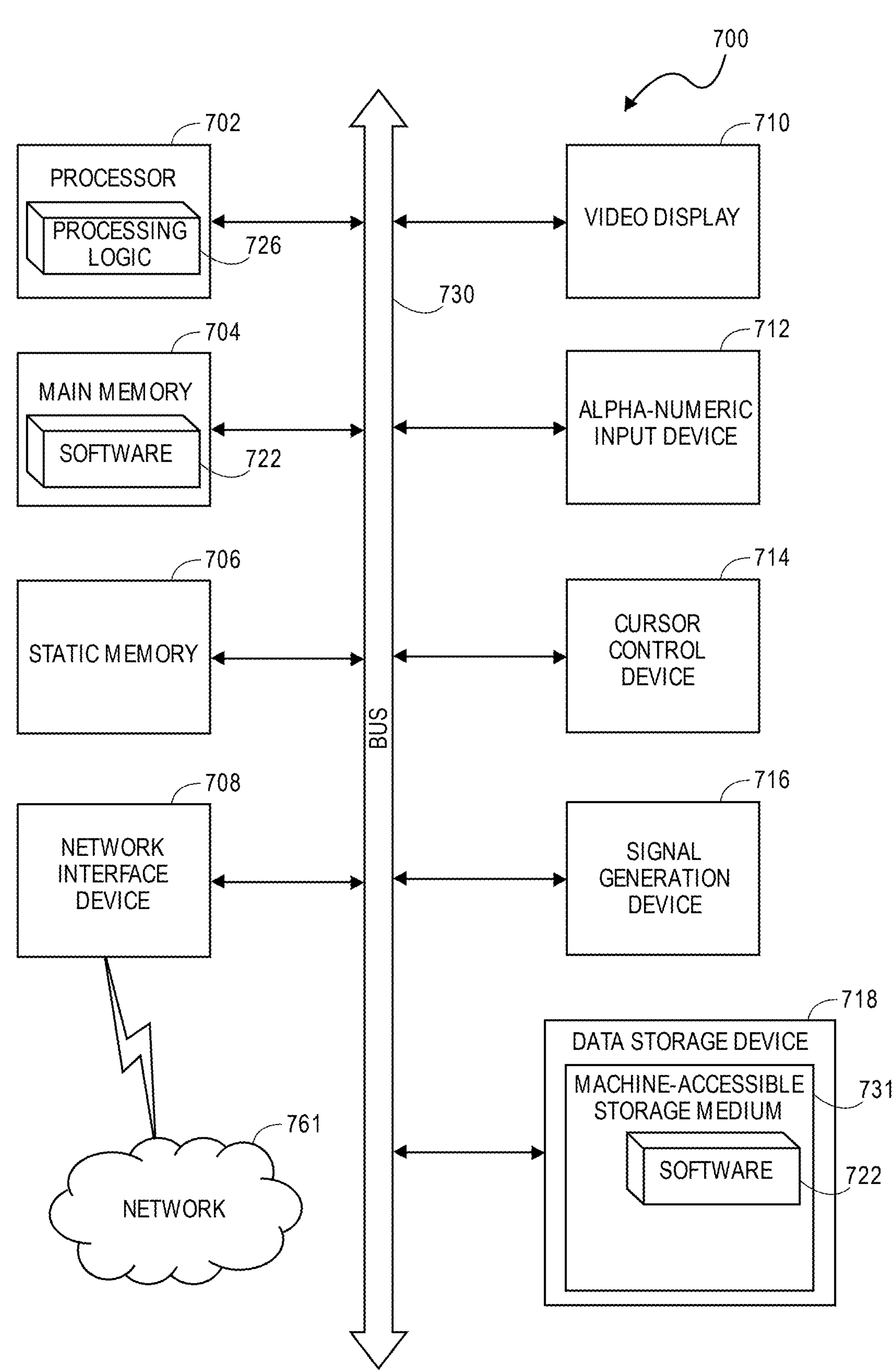
FIG. 7 illustrates a block diagram of an exemplary computer system that may be used in conjunction with a processing tool, in accordance with an embodiment.

Referring now to FIG. 7, a block diagram of an exemplary computer system 700 of a processing tool is illustrated in accordance with an embodiment. In an embodiment, computer system 700 is coupled to and controls processing in the processing tool. Computer system 700 may be connected (e.g., networked) to other machines in a Local Area Network (LAN), an intranet, an extranet, or the Internet. Computer system 700 may operate in the capacity of a server or a client machine in a client-server network environment, or as a peer machine in a peer-to-peer (or distributed) network environment. Computer system 700 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 700, the term "machine" shall also be taken to include any collection of machines (e.g., computers) that individually or jointly execute a set (or multiple sets) of instructions to perform any one or more of the methodologies described herein.

Computer system 700 may include a computer program product, or software 722, having a non-transitory machine-readable medium having stored thereon instructions, which may be used to program computer system 700 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 700 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 700 may further include a system network interface device 708 for communicating with other devices or machines. The computer system 700 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 700, the main memory 704 and the system processor 702 also constituting machine-readable storage media. The software 722 may further be transmitted or received over a network 761 via the system network interface device 708. In an embodiment, the network interface device 708 may operate using RF coupling, optical coupling, acoustic coupling, or inductive coupling.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. An apparatus, comprising:

an electrostatic chuck (ESC) comprising:

a first body that is electrically conductive; and a facility plate coupled to the ESC, wherein the facility plate comprises:

a second body that is electrically conductive;

a hole through the second body;

a DC input connector through the hole; and an RF feed line coupled to the second body, wherein a pin of the DC input connector is electrically isolated from the RF feed line.

2. The apparatus of claim 1, wherein the facility plate is electrically coupled to the ESC by one or more links.

3. The apparatus of claim 1, wherein the pin of the DC input connector is surrounded by an electrically insulating collar.

4. The apparatus of claim 1, wherein the facility plate comprises a fluidic path from a first surface of the second body to a second surface of the second body, wherein the fluidic path comprises a first vertical portion, a horizontal channel, and a second vertical portion.

5. The apparatus of claim 4, wherein the horizontal channel comprises a first branch and a second branch that intersects the first branch.

6. The apparatus of claim 1, wherein the ESC comprises a first fluidic channel and a second fluidic channel.

7. The apparatus of claim 6, wherein the first fluidic channel is an outer zone backside gas channel, and wherein the second fluidic channel is an inner zone backside gas channel.

8. The apparatus of claim 1, wherein a diameter of the facility plate is smaller than a diameter of the ESC.

9. A semiconductor processing tool, comprising:

a chamber suitable for maintaining a vacuum environment within the chamber; and a cathode assembly within the chamber, wherein the cathode assembly comprises:

an electrostatic chuck (ESC) comprising:

a first body that is electrically conductive; and a facility plate coupled to the ESC, wherein the facility plate comprises:

a second body that is electrically conductive;

a hole through the second body;

a DC input connector through the hole; and an RF feed line coupled to the second body, wherein a pin of the DC input connector is electrically isolated from the RF feed line.

10. The semiconductor processing tool of claim 9, wherein the semiconductor processing tool is configured for plasma dicing operations.

11. The semiconductor processing tool of claim 9, wherein the facility plate comprises a fluidic path with a first vertical portion, a second vertical portion, and a horizontal portion that couples the first vertical portion to the second vertical portion.

* * * * *